(12) United States Patent
Mitsuiki

(10) Patent No.: US 6,200,902 B1
(45) Date of Patent: Mar. 13, 2001

(54) METHOD OF ETCHING A LAYER IN A SEMICONDUCTOR DEVICE

(75) Inventor: Akira Mitsuiki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/050,944

(22) Filed: Mar. 31, 1998

(30) Foreign Application Priority Data

Mar. 31, 1997 (JP) .................................................... 9-080836

(51) Int. Cl.[7] .................................................. H01L 21/302
(52) U.S. Cl. ........................ 438/700; 438/702; 438/706; 438/710; 438/714; 438/719
(58) Field of Search ..................... 257/315, 316; 438/421, 706, 710, 714, 719, 725, 733, 700, 702

(56) References Cited

U.S. PATENT DOCUMENTS

| | | | | |
|---|---|---|---|---|
| 5,017,977 | * | 5/1991 | Richardson | 257/316 |
| 5,297,082 | * | 3/1994 | Lee | 365/185 |
| 5,413,966 | * | 5/1995 | Schoenborn | 438/421 |
| 5,414,287 | * | 5/1995 | Hong | 257/316 |
| 5,522,966 | | 6/1996 | Komura et al. | 438/701 |
| 5,568,422 | * | 10/1996 | Fujiwara | 365/185.33 |
| 5,698,072 | * | 12/1997 | Fukada | 438/592 |
| 5,843,226 | * | 12/1998 | Zhao et al. | 117/97 |

FOREIGN PATENT DOCUMENTS

| | | |
|---|---|---|
| 5-243188 | 9/1993 | (JP) . |
| 6-029257 | 2/1994 | (JP) . |
| 7-335614 | 12/1995 | (JP) . |
| 8-306672 | 11/1996 | (JP) . |
| 9-069511 | 3/1997 | (JP) . |

* cited by examiner

Primary Examiner—Benjamin L. Utech
Assistant Examiner—Binh X. Tran
(74) Attorney, Agent, or Firm—Sughrue, Mion, Zinn, Macpeak & Seas, PLLC

(57) ABSTRACT

In the process of simultaneously etching a polysilicon layer in a groove of a memory cell section and a polysilicon layer in a peripheral circuit section, a $Cl_2$/HBr-based gas is used as a first etching step, and this etching is performed until polysilicon in the peripheral section is removed. Next, the gas is switched to a $Cl_2$/HBr/$O_2$-based gas to remove an etched particulate resist film having accumulated in the groove. As a final step, the polysilicon layer remaining in the groove is etched with a HBr/$O_2$-based gas having a high selectivity ratio against an oxide film.

3 Claims, 3 Drawing Sheets

METHOD OF ETCHING A LAYER IN A SEMICONDUCTOR DEVICE

BACKGROUND OF THE INVENTION

The present invention relates to a method of forming a semiconductor device, and more particularly to a method of dry etching a silicon layer to make a groove.

It is a well-known etching method to etch a polysilicon layer by using a resist as a mask. Recently, it has become a requirement to complete the etching more quickly. The polysilicon layer is therefore etched using the resist as a mask by using an etching gas which has low selectivity against the resist to remove the polysilicon quickly as a first etching step before the resist is completely removed from polysilicon. As such, a resist is etched at the same time as the polysilicon. Then, as a second step, the polysilicon is etched with using the remaining resist as a mask by using an etching gas which has high selectivity against the resist. As such in the second step, the polysilicon is etched almost without etching the resist. Thus etching is achieved by the two step process etching. However, during the first etching step, the etching of the resist results in particulate etched resist which is re-deposited (settles) on the surface of the polysilicon. Therefore a problem occurs in that the polysilicon is not properly etched to the desired shape because of the re-deposited resist found on the polysilicon as a result of the first etching step just prior to the second etching step, acting as a mask to the second etching step.

SUMMARY OF THE INVENTION

It is therefore an object of the present invention to provide a method of etching a polysilicon layer properly and efficiently to a desired shape regardless of any re-deposited resist existing on the polysilicon layer.

An etching method according to the present invention comprising the steps of: etching with a first etching gas a first portion of a layer and a resist film, using the resist film as a mask, thereby forming an re-deposited etched particulate resist film, which is caused by etching said resist film, on a surface of said layer; removing said re-deposited etched particulate resist film by using a second etching gas, and etching a second portion of said layer by using a third etching gas.

An etching method for a silicon layer according to the present invention is directed in one embodiment having one portion of a polysilicon layer formed over a substrate and another portion of a polysilicon layer buried into a groove. As a first step, the first portion of the polysilicon layer (other than the another portion in the groove) is etched by a dry etching method using a Cl$_2$/HBr-based gas. Next, as a second step, a etched resist particulate film having accumulated in the groove by etching at the first step is etched by a dry etching method using a Cl$_2$/HBr/O$_2$-based gas. Then, as a third step, the remaining another portion of the polysilicon layer in the groove is etched by a dry etching method using an HBr/O$_2$-based gas.

BRIEF DESCRIPTION OF THE DRAWINGS

The above and other objects, advantages and features of the present invention will be more apparent from the following description taken in conjunction with the accompanying drawing, in which.

DETAILED DESCRIPTION OF THE PREFERRED EMBODIMENTS

The related art will be explained before the embodiments of the present invention will be explained.

Figure 1A:
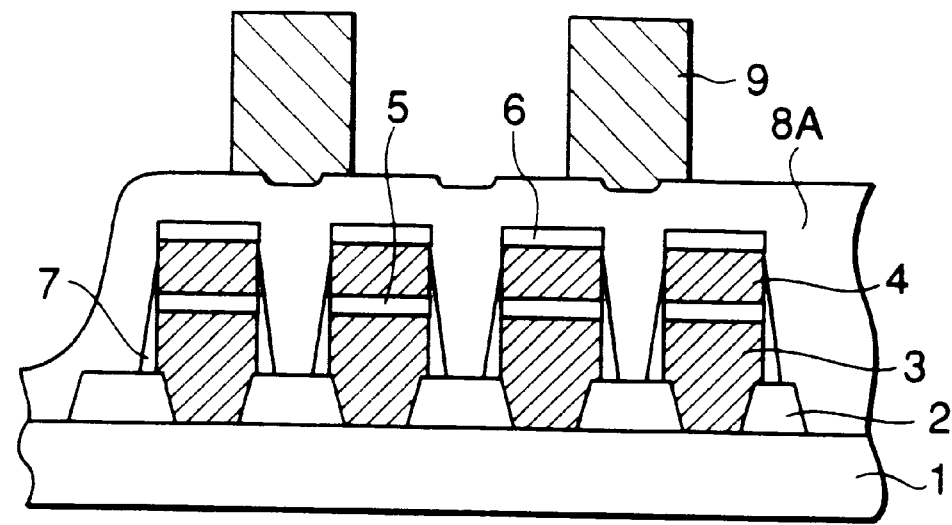
FIGS. 1A and 1B are cross-sectional diagrams of a semiconductor device according to one step of a first embodiment of the present invention.
Figure 1B:
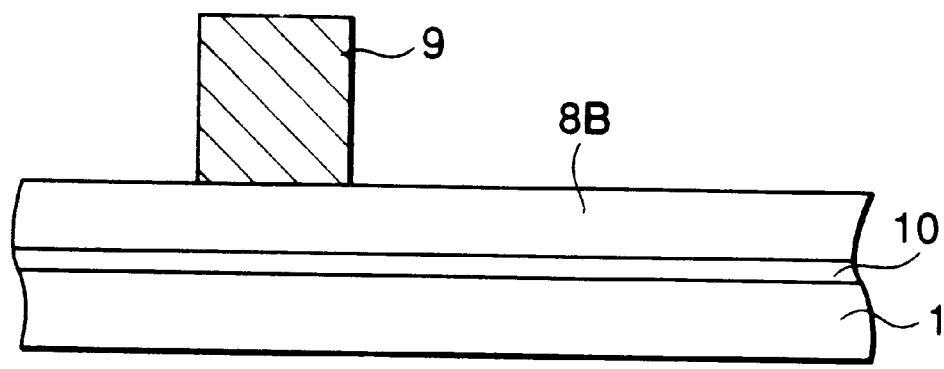

FIGS. 1A and 1B show cross-sectional views of a step for forming a flash memory which has an erase gate besides a floating gate and a control gate. FIG. 1A shows a flash memory cell portion and FIG. 1B shows a peripheral circuit portion. As shown in FIG. 1A, a polysilicon layer 8A, which will become an erase gate, is formed in grooves (e.g. 0.2 $\mu$m in width and 0.6 $\mu$m in depth), which are narrow and deep, between floating gates 3 and control gates 4 with element separating oxide films 2 in-between on a silicon substrate 1. Further, since the polysilicon layer 8A is formed at a later stage of polysilicon film formation, as shown in FIG. 1B, a polysilicon layer 8B is also formed for the gate electrode of a transistor in a peripheral circuit.

It is necessary to simultaneously etch the polysilicon layer 8B for the gate electrode of the transistor in the peripheral circuit and the polysilicon layer 8A between the floating gates 3. Here, the film thicknesses of the polysilicon layer 8B of the peripheral circuit and of the polysilicon layer 8A in the deep part of the grooves are about 300 nm and 900 nm (including the 600 nm depth of the grooves), respectively. Incidentally, the polysilicon layer 8B for the gate electrode of the transistor of the peripheral circuit is formed over a thermally oxidized film as a gate oxide film 10 of 30 nm or less.

Figure 2A:
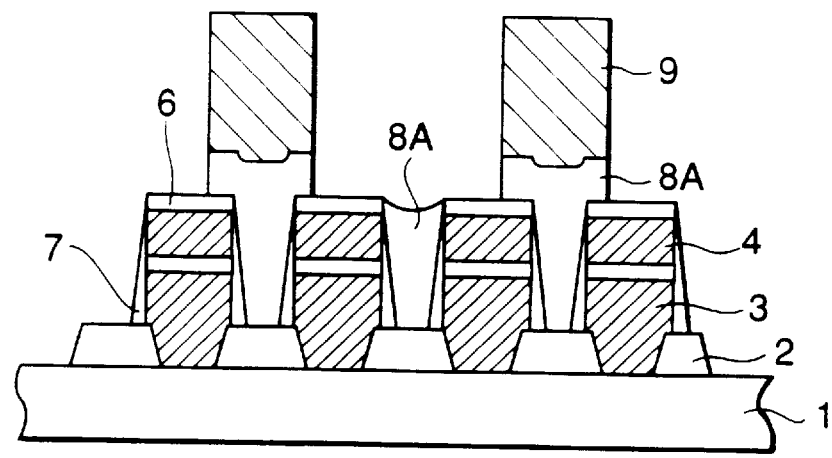
FIGS. 2A and 2B are cross-sectional diagrams of a semiconductor device according to another step of the first embodiment of the present invention.
Figure 2B:
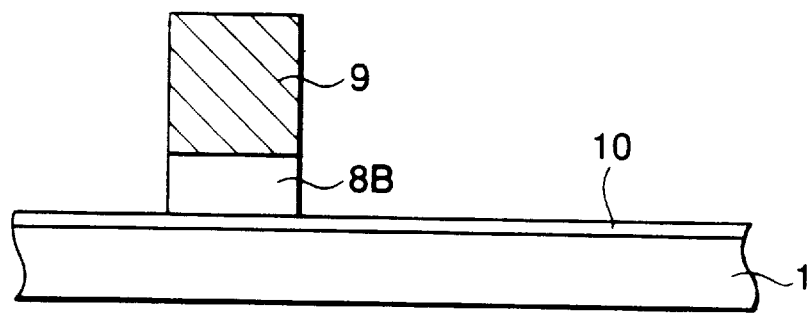

By this etching method for the polysilicon layers 8A and 8B, as a first step, the polysilicon layer 8B is etched until the gate oxide film 10 of the undercoat of the peripheral circuit section is exposed, as shown in FIG. 2B, using a chlorine (Cl)$_2$/hydrogen and Bromine (HBr)-based gas and a photo-resist film 9 as a mask. That is, as a first step, etching is performed under the aforementioned conditions of about 10 to 30 in selectivity ratio against an oxide film and the etch rate is high (not less than 300 nm/min) without paring (removing) the undercoat gate oxide film 10 and removing any native oxide film on the polysilicon layer which could undesirably functioning as the mask.

However, as the polysilicon layer 8A remains in the grooves as shown in FIG. 2A, the etching step is switched so that the polysilicon layer 8A in the narrow and deep grooves is removed by an etching method using an HBr/Oxygen (O)$_2$-based gas having an extremely high selectivity ratio against an oxide film.

Thus, so that the gate oxide film 10 would not be etched, the etching conditions are changed to the use an HBr/O$_2$-based gas, whose selectivity ratio against an oxide film is higher than under the etching conditions of the first step, and the etching of the polysilicon layer in the grooves is performed thereby.

Figure 3:
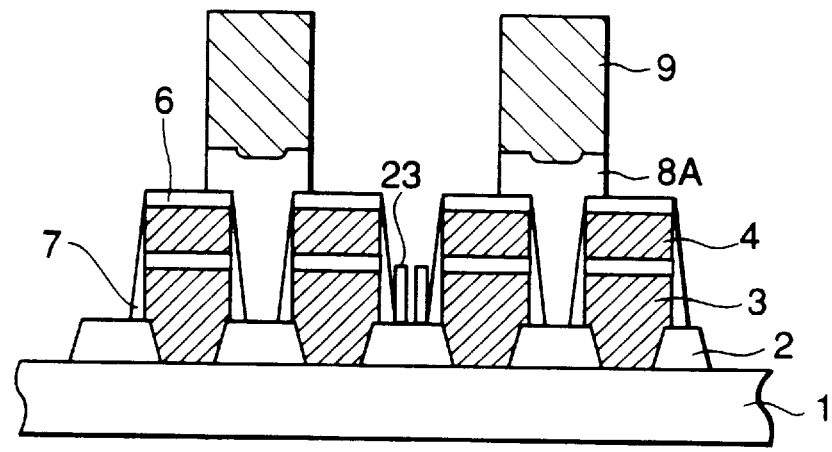
FIG. 3 is a cross-sectional diagram of a semiconductor device for describing disadvantages of the related art.

However, when the polysilicon layer 8A is etched by the above-mentioned method, as shown in FIG. 3, column-shaped residues 23 of polysilicon are formed on the bottom of the grooves. A likely cause is that a deposition film of carbon-based particulate occurring from partial etching of the resist film (which is the etching mask during the first etching step) accumulates in the narrow and deep grooves near the surface of the polysilicon layer 8A. This accumulation of photoresist particulate acts as a mask at the time of etching during the second step without being removed and results in formation of the unwanted column-shaped polysilicon residues 23.

To describe this process in detail, since a $Cl_2$/HBr-based gas is used at the first step, etching proceeds while simultaneously etching the resist. At this time, etching particulate from the simultaneously etched resist accumulates on the surface of the polysilicon layer. On account of the structure of this device shown in FIG. 1A, the grooves, having a different level, are between resist films, and there is a structure particularly susceptible to the accumulation of etched resist particulate. Since etching at the first step is performed using a $Cl_2$/HBr-based gas, the speed of its accumulation is not higher than the etching speed. Therefore, the etched particulate resist film is etched while polysilicon is being etched so that it does not cause the etching to be stopped. However, when the gate oxide film has become exposed in the peripheral circuit section, it is necessary to change the gas to $HBr/O_2$ having a higher selectivity ratio against an oxide film so that the gate oxide film will not be etched. Here, since this gas has a low etching rate against the resist, the etched resist particulate deposited as a film cannot be sufficiently etched, accordingly the etched resist particulate becomes an etching mask, giving rise to column-shaped residues 23.

Thus, as stated above, the method involved the problem that the etched particulate photoresist accumulated by etching at the first step became an etching mask at the second step, giving rise to column-shaped residues of polysilicon. In order to overcome this problem, it is necessary either to etch the deposited etched particulate photoresist film with the polysilicon during the second step (like occurs during the first step) or to remove the deposited etched particulate photoresist film attributable to accumulated resist. To use the former method, one alternative is to raise the etch rate of the resist film. However, raising the etch rate against the resist film with this type of gas, the etch rate of the oxide film will also rise, resulting in the gate oxide film and silicon substrate being etched in the peripheral circuit, while the polysilicon layer in the groove part is being etched. Therefore, the manufacturing yield of the semiconductor apparatus will decrease.

Referring to FIGS. 1A–1B, 2A–2B and 4, a first embodiment of the present invention will now be explained. First, with respect to the cell section, as shown in FIG. 1A, element separating oxide films 2 having a thickness of almost 300 nm are formed over a silicon substrate 1, and a polysilicon layer, which will become a floating gate is grown to a thickness of 200 to 300 nm. Next, this polysilicon layer is patterned, using a mask consisting of a photoresist film, to form floating gates 3. Next, insulating films 5 consisting of an oxide film and the like are formed over them to a thickness of 10 to 20 nm. Next, a polysilicon layer of 200 to 300 nm, which will become control gates, and insulating films 6 are formed over them. Then control gates 4 are formed by patterning. Next, insulating films 7 are formed as side walls to the floating gates 3 and to the control gate 4. After that, a polysilicon layer 8A, which will become an erase gate, is formed all over to a thickness of 300 nm. On the other hand, in the peripheral circuit section, as shown in FIG. 1B, the polysilicon layer 8B is formed over a gate oxide film 10 for a gate electrode.

Figure 6:
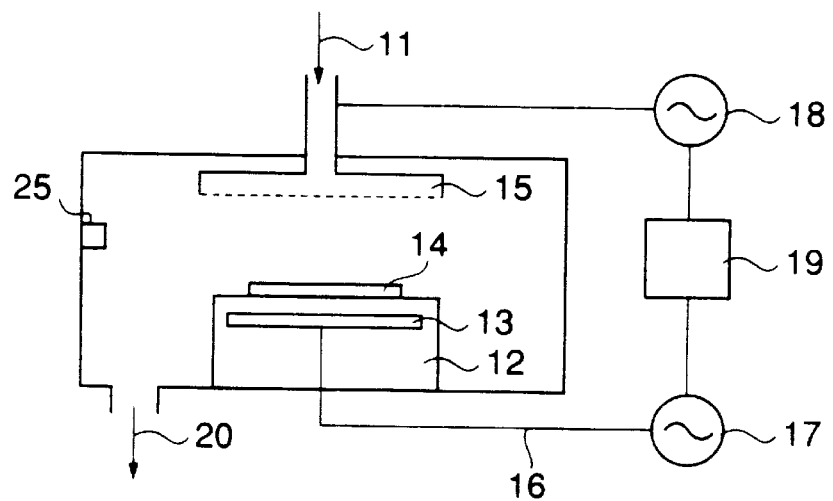
FIG. 6 is a structural diagram of an etching apparatus used for the embodiments of the present invention.

Polysilicon layers 8A and 8B are subjected to 3-step etching with a photoresist film 9 as the mask. The dry etching apparatus for etching a polysilicon film, as shown in FIG. 6, is of an IEM (ion energy modulation) type. In this apparatus, a wafer 14, which is the sample to be etched, is placed on a stage 12. Input gas 11 is supplied from a shower head 15. The gas is subjected to the application of power from an upper electrode 15 and a lower electrode 13, having an upper RF 18 and a lower RF 17 as power sources, to generate plasma. Incidentally, the upper and lower phase controls are performed with a modulator 19. Further, gas discharge 20 is accomplished through an exhaust pipe. A characteristic of this etcher is its ability to generate plasma in the order of $1 \times 10^{11}$ $cm^{-3}$ in plasma density. Each step of etching will be described below. Etching at the first step uses the following conditions.

$Cl_2$/HBr=150/450 sccm
Pressure=100 mTorr
Upper and lower RF power=500/300 W
Difference between upper and lower RF phases=180°

Under these conditions, the etch rate of the polysilicon layer is 350 to 400 nm/min, and the selectivity ratio of the polysilicon layer versus an oxide film is about 20 to 30.

First, using the conditions of this first step, as shown in FIGS. 2A and B, etching is performed until the polysilicon layer 8B of the peripheral circuit section is removed and the gate oxide film 10 is exposed. Of course, the polysilicon layer 8A is also etched. Incidentally, the end point of etching is detected using an end point detector 25. If, at this time, etching is performed too long, the gate oxide film 10 will be etched, and the silicon substrate 1 will also be etched. Therefore, etching is monitored at this step so that etching continues only until the gate oxide film 10 is exposed. The end point detector 25, detects the strength of the emission of light (luminescence) of plasma in a reaction chamber with a predetermined wavelength. In this embodiment, the end point detector 25 monitors the strength of the luminescence of plasma based on a silicon compound as reaction-produced material which is produced by the etching with the wavelength of 405 nm. When lit the polysilicon film 8B is etched and does not exist, the luminescence produced by the silicon compound is reduced and the strength of the luminescence becomes weaker. At the time when the strength of the luminescence detected by the detector 25 is lower than a predetermined level, the end point of etching the polysilicon has been reached.

Incidentally, the selectivity ratio against an oxide film, considering that a natural or native oxide film is formed on the surface of the polysilicon layer, should desirably be not more than 30.

Next, at the second step, etching is performed to remove the deposited etched particulate photoresist film having accumulated on the surface of the polysilicon layer. Etching at the second step uses the following conditions.

$Cl_2$/HBr/$O_2$=150/450/15 sccm
Pressure=100 mTorr
Upper and lower RF power=500/150 W
Difference between upper and lower RF phases=135°

Under these conditions, the etch rate of the polysilicon layer is 250 to 300 nm/min, and the selectivity ratio of the polysilicon layer versus the oxide film is about 50 to 60 so that the substrate of the peripheral circuit section will not be damaged and the removal of the etched particulate photoresist deposited at the first step is made possible.

Etching during the second step is performed under these conditions and if etching is performed for about 30 to 60 seconds using this gas, for the aforementioned reason, further accumulation of particulate photoresist can be prevented while removing the deposited particulate photoresist film that accumulated as a result of the first step. Further, since the selectivity ratio against the oxide film is higher than in the first step etching, it is possible to perform etching without heavily paring (removing) the undercoat gate oxide film 10. It is noted that the polysilicon layer 8A may also be slightly etched at the second step.

The reasons why improved etching is performed at the gas flow rate ratio of $Cl_2$:HBr:$O_2$=(5–20):(20–40):(1–2). First, regarding the ratio between $Cl_2$ and HBr, if the proportion of $Cl_2$ is higher than 20, the etch rate of the resist film will become greater which is undesirable. Alternatively, if, the proportion of HBr is higher than 40, the accumulated deposited particulate photoresist film cannot be sufficiently etched. With regard to the proportion of $O_2$, if the proportion of $O_2$ is lower than 1, the effect of preventing and overcoming the accumulation of deposited particulate photoresist cannot be obtained, and the selectivity ratio against the oxide film will also drop. If, conversely, the proportion of $O_2$ is higher than 2, the accumulated deposition film cannot be etched. For the foregoing reason, the gas ratio at this step is set as stated above.

Further, the gas used for the second step was not used for etching at the first step for reasons that: (1) its higher selectivity ratio against the oxide film would give rise to residues with the natural oxide film on the surface functioning as the mask, and (2) an SiO-based deposition film would be generated in a large quantity.

Next, etching at the third step is performed to etch the polysilicon layer 8A in the grooves. Etching at the third step uses the following conditions.

HBr/$O_2$=150/5 sccm
Pressure=100 mTorr
Upper and lower RF power=500/150 W
Difference between upper and lower RF phases=135°

Under these conditions, the etch rate of the polysilicon layer is 200 to 250 nm/min. Further, the selectivity ratio of the polysilicon layer versus the oxide film is infinite. That is to say, the etching rate of the oxide film is substantially 0.

At this third step, since it is the final step, the approximately 500 nm polysilicon layer remaining in the groove is wholly removed. Further, since the undercoat oxide film 10 is fully exposed in the peripheral circuit section by this point of time, and the approximately 500 nm polysilicon layer remaining in the grooves at this time has to be removed, the selectivity ratio against the oxide film should be infinite, i.e. the conditions should be such that the oxide film 10 will not be removed at all.

Figure 4:
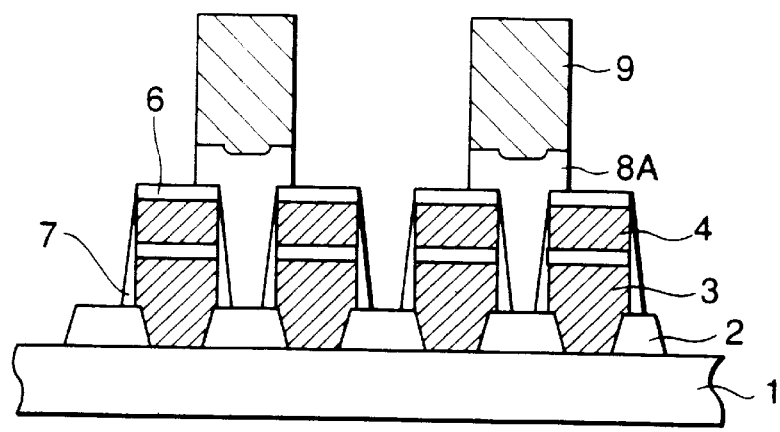
FIG. 4 is a cross-sectional diagram of a semiconductor device according to another step of the first embodiment of the present invention.

Further, since this etching is performed using $O_2$ in a state where the polysilicon layer still remains and accordingly the SiO-based deposition film is stuck, wet or dry treatment should be done with fluorine (F)-based substance before removing the resist film. By this treatment, as shown in FIG. 4, the unnecessary polysilicon layer 8A in the grooves is fully removed, leaving no residual film.

Accordingly, one main feature of the present invention is a step of etching with a $Cl_2$/HBr/$O_2$-based gas which is inserted between etching with a $Cl_2$/HBr-based gas and etching with a HBr/$O_2$-based gas. The insertion of this step makes it possible to etch the polysilicon layer 8A without leaving column-shaped residue 23, for the reasons explained below. First, the etched particulate photoresist film having accumulated at the first step conceivably derives mainly from the deposition of a carbon-based substance generating from the photoresist. If it is attempted to remove the etched particulate photoresist with HBr/$O_2$ gas, it will remain unremoved because the photoresist etching rate is essentially low for this type of gas. However, if etching is performed with a $Cl_2$/HBr/$O_2$-based gas, the resist will also be etched with the result that the accumulated etched particulate photoresist film is etched so that the etching of the polysilicon layers will progress with nothing left.

Moreover, regarding the accumulation of the etched particulate photoresist film, as $O_2$ is contained in the gas, the dissociation of the carbon-based deposition proceeds in the plasma, and C, accompanied by O, is thus discharged. Further, since this type of gas has a higher selectivity ratio against an oxide film than in etching at the first step, there is a safety margin against damage to the substrate of the peripheral circuit section. Therefore, by using this $Cl_2$/HBr/$O_2$-based gas, the accumulated etched participate photoresist film is removed, and no particulate photoresist film is newly etched so that it does not again accumulate. Using an HBr/$O_2$-based gas for etching at the third step in this state, as the carbon-based deposition film which had become a mask is removed by this point of time, the silicon layer can be etched without leaving any column-shaped residue.

Figure 5:
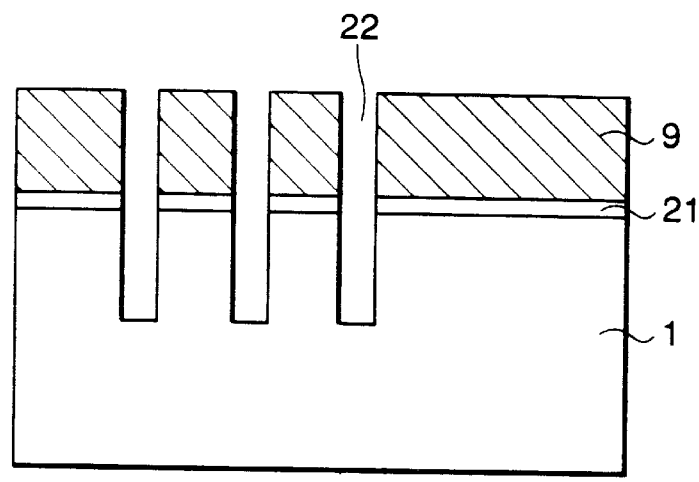
FIG. 5 is a cross-sectional diagram of a semiconductor device according to a second embodiment of the present invention.

FIG. 5 is a cross-sectional diagram of a semiconductor device according to a second embodiment of the present invention. This figure illustrates an example in which the invention is applied to the formation of deep grooves in a silicon substrate using only a resist mask.

In the structure of the sample to be etched after etching, as shown in FIG. 5, grooves 22 of 2 to 4 μm in depth and 0.1 to 0.2 μm in width are provided in a silicon substrate 1, and the silicon substrate 1 is patterned with a resist film 9. Under the resist film 9 is formed a pad oxide film 21 of 5 to 30 nm to prevent contact between the resist film 9 and silicon substrate 1. In order to form grooves of such a structure, etching is performed in the following procedure.

First, etching is performed under the same conditions as the first step for the first embodiment. Since the selectivity ratio against an oxide film under these conditions is 20 to 30, the natural oxide film on the surface of the silicon substrate 1 can also be etched with no problem. However, as the selectivity ratio against the resist is 2 to 3, etching is stopped so that a corner of the resist will not be removed. That is, when the first step is performed, the resist is also etched and the corner of the resist is etched faster than the other top surface of the resist so that the corner is rounded. It is necessary to stop etching before the edge of the rounded corner of the mask reaches the surface of the silicon substrate, so as not to expose the surface of the silicon substrate to be covered with the mask. At this point in time, like in the first embodiment, at the first step there is an accumulation of etched particulate photoresist film, which might give rise to residues of silicon, on the bottom of the grooves (not shown). Therefore, using the etching conditions of the second step assisted in the first embodiment, the etched particulate photoresist which accumulates on the bottom of the grooves is removed. Finally, under the same etching conditions as the third step of the first embodiment, etching is performed to a desired depth. Since the selectivity ratio against the resist at this step is 10 to 15, higher than under the conditions of the first step, deeper etching is possible using masking with only the resist film.

After etching is performed by this method, wet or dry treatment is done with F-based substance like in the first embodiment. By using the foregoing process, a deep and narrow groove structure can be formed under masking with only the resist film, without formation of residual silicon column shaped pillars occurring.

As herein described, the present invention, in etching the polysilicon layer in grooves, makes possible etching of the polysilicion film in the peripheral circuit section without etching undercoat gate oxide and without giving rise to column-shaped residues by inserting a step using a $Cl_2/HBr/O_2$-based gas between a first etching step ($Cl_2/HBr$) and a second etching step ($HBr/O_2$). Furthermore, it makes possible ready formation of narrow and deep grooves in the silicon substrate.

It is apparent that the present invention is not limited to the above embodiments but may be modified and changed without departing from the scope and spirit for the invention. For example, the inclusion of the $Cl_2/HBr/O_2$ etching step can be added at any point during semiconductor processing where a photoresist film has been exposed to an etchant which is likely to cause etched particulate photoresist to undesirably deposit on a layer that must be subsequently etched to a desired shape. As is clearly understood, etched particulate photoresist is generally undesirable because it will result in unintended pattern formation shape so as to alter the intended semiconductor structure.

What is claimed is:

1. A method of forming a semiconductor device, comprising:

forming first and second floating gates apart from each other over a flash memory cell portion of a semiconductor substrate;

forming first and second control gates apart from each other over said first and second floating gates respectively;

forming first and second insulating film apart from each other on said first and second control gate;

forming side walls formed on side surfaces of said first and second floating gates, said first and second control gates, and said first and second insulating films, thereby forming a groove between both said first floating gate, said first control gate and said first insulating film and both said second floating gate, said second control gate and said second insulating film;

forming a gate insulating film on a peripheral portion of said semiconductor substrate;

forming a silicon layer on said gate insulating film and on said first and second insulating films while burying said groove;

forming a first resist pattern on said silicon layer over portions of said first and second insulating films so as not to cover over said groove and a second resist pattern on said silicon layer over said gate insulating film, said first and second resist pattern including carbon;

etching said silicon layer with using said first and second resist patterns as masks by using a gas including $Cl_2/HBr$ until said gate insulating film is exposed, at that time, forming an etched particulate resist layer on a surface of said silicon layer in said groove;

etching said etched particulate resist layer by using a gas including $Cl_2/HBr/O_2$; and etching said silicon layer in said groove with said first and second resist patterns as masks by using a gas including $HBr/O_2$.

2. The method as claimed in claim 1, wherein flow rate of said gas including $Cl_2/HBr/O_2$ is $Cl_2:HBr:O_2=(5-20):(20-40):(1-2)$.

3. The method as claimed in claim 2, wherein an end point of etching by using the gas including $Cl_2/HBr$ is detected by an end point detector to indicate switching to the etching using the gas including $Cl_2/HBr/O_2$.

* * * * *